United States Patent
Frisco et al.

(10) Patent No.: US 11,681,231 B2
(45) Date of Patent: Jun. 20, 2023

(54) SELECTING A SET OF LOCATIONS ASSOCIATED WITH A MEASUREMENT OR FEATURE ON A SUBSTRATE

(71) Applicant: ASML NETHERLANDS B.V., Veldhoven (NL)

(72) Inventors: Pierluigi Frisco, Eindhoven (NL); Svetla Petrova Matova, Waalre (NL); Jochem Sebastiaan Wildenberg, Aarle-Rixtel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/686,586

(22) Filed: Mar. 4, 2022

(65) Prior Publication Data

US 2022/0187714 A1    Jun. 16, 2022

Related U.S. Application Data

(63) Continuation of application No. 16/339,884, filed as application No. PCT/EP2017/073866 on Sep. 21, 2017, now Pat. No. 11,294,289.

(30) Foreign Application Priority Data

Oct. 14, 2016  (EP) ..................................... 16193903
Mar. 13, 2017  (EP) ..................................... 17160587

(51) Int. Cl.
*G03F 7/20*  (2006.01)
*G03F 9/00*  (2006.01)
*G03F 7/00*  (2006.01)

(52) U.S. Cl.
CPC .......... *G03F 7/705* (2013.01); *G03F 7/70616* (2013.01); *G03F 7/70641* (2013.01);
(Continued)

(58) Field of Classification Search
CPC ................ G03F 7/705; G03F 7/70616; G03F 7/70641
(Continued)

(56) References Cited

U.S. PATENT DOCUMENTS

| | | | | |
|---|---|---|---|---|
| 6,493,658 | B1 * | 12/2002 | Koford | ................ G06F 30/392 |
| | | | | 716/135 |
| 2001/0053962 | A1 | 12/2001 | Yoshida et al. | |
| 2006/0190207 | A1 | 8/2006 | Whitefield et al. | |
| 2007/0103665 | A1 * | 5/2007 | Zimmerman | ....... G03F 7/70125 |
| | | | | 355/68 |

(Continued)

FOREIGN PATENT DOCUMENTS

| | | |
|---|---|---|
| CN | 102163000 | 8/2011 |
| EP | 0864929 | 9/1998 |

(Continued)

OTHER PUBLICATIONS

International Search Report and Written Opinion issued in corresponding PCT Patent Application No. PCT/EP2017/073866, dated Dec. 1, 2017.

(Continued)

*Primary Examiner* — Suresh Memula
(74) *Attorney, Agent, or Firm* — Pillsbury Winthrop Shaw Pittman, LLP

(57) ABSTRACT

A method for selecting an optimal set of locations for a measurement or feature on a substrate, the method includes: defining a first candidate solution of locations, defining a second candidate solution with locations based on modification of a coordinate in a solution domain of the first candidate solution, and selecting the first and/or second candidate solution as the optimal solution according to a constraint associated with the substrate.

20 Claims, 11 Drawing Sheets

(52) U.S. Cl.
CPC .......... *G03F 9/7026* (2013.01); *G03F 9/7046* (2013.01); *G03F 9/7076* (2013.01); *G03F 9/7084* (2013.01)

(58) Field of Classification Search
USPC .......................................................... 716/51
See application file for complete search history.

(56) References Cited

U.S. PATENT DOCUMENTS

| | | | | |
|---|---|---|---|---|
| 2008/0228435 | A1* | 9/2008 | Lee ................... | G03F 7/70633 702/150 |
| 2010/0009272 | A1* | 1/2010 | Kawashima ........ | G03F 7/70125 430/5 |
| 2011/0173578 | A1 | 7/2011 | Tsai et al. | |
| 2011/0205511 | A1 | 8/2011 | Padiy et al. | |
| 2012/0123748 | A1 | 5/2012 | Aben et al. | |
| 2017/0262564 | A1 | 9/2017 | Liu | |

FOREIGN PATENT DOCUMENTS

| | | | | |
|---|---|---|---|---|
| EP | 3309617 | A1 * | 4/2018 | |
| EP | 3392711 | A1 * | 10/2018 | ......... G03F 7/70491 |
| JP | 2008140991 | | 6/2008 | |
| JP | 5198588 | | 2/2013 | |
| KR | 100817092 | | 3/2008 | |
| KR | 20130025941 | | 3/2013 | |
| KR | 20190005955 | A * | 1/2019 | |
| TW | 201626116 | | 7/2016 | |
| WO | 2015110191 | | 7/2015 | |
| WO | WO-2015110191 | A1 * | 7/2015 | ........... G01B 11/272 |
| WO | 2016128190 | | 8/2016 | |

OTHER PUBLICATIONS

Taiwanese Office Action issued in corresponding Taiwanese Patent Application No. 106134708, dated Jul. 16, 2018.
Shao, C.: "Data-Based Spatial and Temporal Modeling for Surface Variation Monitoring in Manufacturing", Doctoral Dissertation (Mechanical Engineering), University of Michigan (2016).
Korean Office Action issued in corresponding Korean Patent Application No. 10-2019-7013514, dated Jan. 29, 2021.
Chinese Office Action issued in corresponding Chinese Patent Application No. 2017800634028, dated Aug. 3, 2020.
Korean Office Action issued in corresponding Korean Patent Application No. 10-2019-7013514, dated Jun. 29, 2020.

* cited by examiner

SELECTING A SET OF LOCATIONS ASSOCIATED WITH A MEASUREMENT OR FEATURE ON A SUBSTRATE

This application is a continuation of U.S. patent application Ser. No. 16/339,884, filed Apr. 5, 2019, which is the U.S. national phase entry of PCT patent application no. PCT/EP2017/073866, which was filed on Sep. 21, 2017, which claims the benefit of priority of European patent application no. 16193903.8, which was filed on Oct. 14, 2016, and of European patent application no. 17160587.6, which was filed on Mar. 13, 2017, each of the foregoing applications is incorporated herein in its entirety by reference.

FIELD

The present description relates to a method of selecting an optimal solution comprising an optimal set of locations associated with a measurement or feature on a substrate, an associated apparatus and a computer program.

BACKGROUND

A lithographic apparatus is a machine applying a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Whichever type of apparatus is employed, the accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Another challenge for lithographic apparatuses is to expose all patterns on the substrate with sufficient focus uniformity. This is important so that the yield across the substrate does not suffer from de-focus failures, apart from at the very edge of the substrate. A printed image on the substrate has sufficient contrast only in a limited (vertical) range around a best focus of exposure. Out-of-focus exposure can cause not only reduced contrast but in some cases change in the critical dimensions of the patterns. Imperfections in semiconductor processing equipment and processing (e.g., lithography, etch, bake, polish and anneal) can introduce imperfections across a substrate. A pattern of imperfections is known as a process fingerprint. Such imperfections result in process distortions which can cause overlay or focus errors. It is normal to characterize the process fingerprints directly in terms of correctable parameters of the lithographic apparatus.

Consequently, modern lithography apparatuses involve extensive measurement or 'mapping' operations prior to the step of actually exposing or otherwise patterning the substrate at a target location. These operations, being time-consuming, limit the throughput of the lithography apparatus, and consequently increase the unit cost of the semiconductor integrated circuits or other products.

A process fingerprint such as a focus or overlay fingerprint is determined by measuring or placing features at locations on the substrate.

As pattern features become smaller and overlay performance requirements become ever more demanding, so-called advanced alignment models and focus models have been and continue to be developed to model and correct more accurately distortions of the "wafer grid". These advanced models depend on measuring an increased number of target features across the substrate. Ultimately, however only a limited number of the available target features can be measured without unduly limiting the throughput of the lithographic process as a whole. Focus variations across the substrate have a high frequency of occurrence, which requires a certain number of target features per exposure image to be placed and measured, in order to capture the focus fingerprint with sufficient accuracy.

Selecting the optimal set of locations on a substrate for measurements or placing features can improve the accuracy of determining process fingerprints.

A cross-wafer sampling algorithm, or sample scheme optimizer, may be used to select the optimal set of locations on a substrate for measurements. The sampling algorithm determines the fingerprint of for example overlay or substrate deformations across the substrate. The constraints are that locations need to be distributed with sufficient density, while being distributed across the entire substrate. Open areas should be avoided. The number of sample points should be limited to reduce the impact on measurement time. The sampling algorithm should be fast enough to be practical in a production environment.

A field sampling algorithm, or mark-layout optimizer, may be used to select the optimal set of locations on a substrate for placing target features. The field sampling algorithm has other requirements. It needs to facilitate the determination of a field-specific fingerprint, for example focus. The constraints are the allowed focus marks locations, the maximum number of marks, etc.

Known methods do not achieve cross-wafer and cross-field sampling while being flexible enough to handle the abovementioned constraints.

SUMMARY

There is provided herein a method which is able to achieve optimal cross-wafer and cross-field sampling while being flexible enough to handle the above-mentioned constraints and other constraints.

According to an aspect, there is provided a method for selecting an optimal solution comprising an optimal set of locations on a substrate associated with positions configured for performing measurements or placement of features, the method comprising the steps of: defining a first candidate solution comprising a first set of locations; defining a second candidate solution comprising a second set of locations based on modification of a coordinate in a solution domain of the first candidate solution, wherein the modification of the coordinate involves an operation selected from one or more of: duplication, mutation and cross-over; and selecting the first and/or second candidate solution as the optimal solution according to a constraint associated with one or more of: available positions for placement of features on the substrate, available measurement time, a minimum amount of measurements or features associated with a region on the substrate and a required degree of uniformity of measurement or feature locations as distributed across the substrate.

According to an aspect, there is provided a method for selecting an optimal solution comprising an optimal set of locations on a substrate associated with positions configured for performing measurements or placement of features, the method comprising the steps of: defining a first candidate solution comprising a first set of locations; defining a second candidate solution comprising a second set of locations based on modification of a coordinate in a solution domain of the first candidate solution; and selecting the first and/or second candidate solution as the optimal solution according to a constraint associated with one or more of: available positions for placement of features on the substrate, available measurement time, a minimum amount of measurements or features associated with a region on the substrate and a required degree of uniformity of measurement or feature locations as distributed across the substrate, wherein the first and second candidate solutions are states in a search space comprising the solution domain and the steps are performed according to a simulated annealing approach.

According to an aspect, there is provided a computer program comprising computer readable instructions which, when run on suitable computer apparatus, cause the computer apparatus to perform a method as described herein.

According to an aspect, there is provided a computer program product comprising the computer program as described herein.

According to an aspect, there is provided an apparatus specifically adapted to carry out the steps of a method as described herein. The apparatus may be configured as a lithographic apparatus operable to perform a lithographic process on said substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
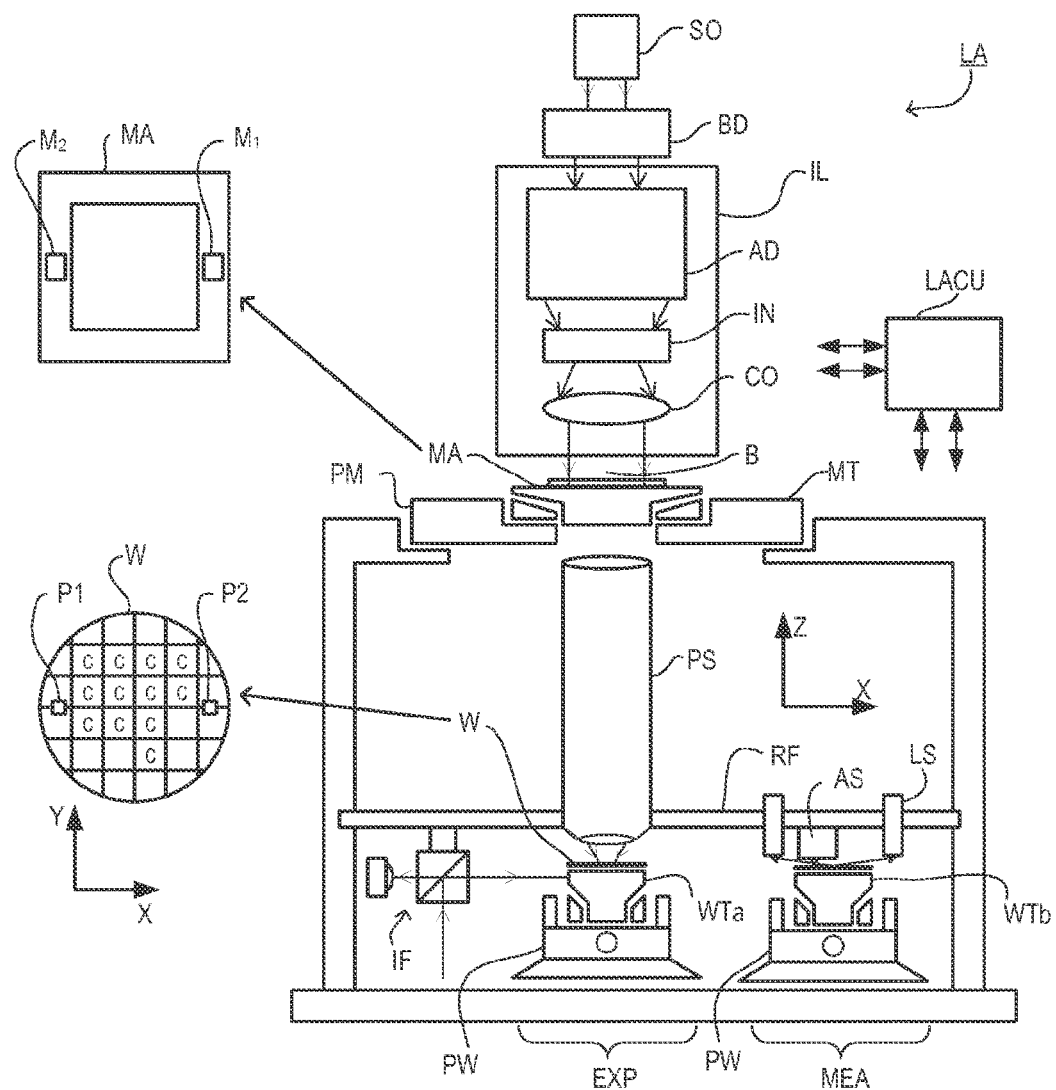
FIG. 1 depicts a lithographic apparatus according to an embodiment of the invention.

FIG. 1 schematically depicts a lithographic apparatus LA according to one embodiment of the invention. The apparatus comprises:

- an illumination system (illuminator) IL configured to condition a radiation beam B (e.g. UV radiation or EUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. An embodiment of the invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface of the substrate using a level sensor LS and measuring the position of alignment mark on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. An embodiment of the invention can be applied in apparatus with only one substrate table, or with more than two.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
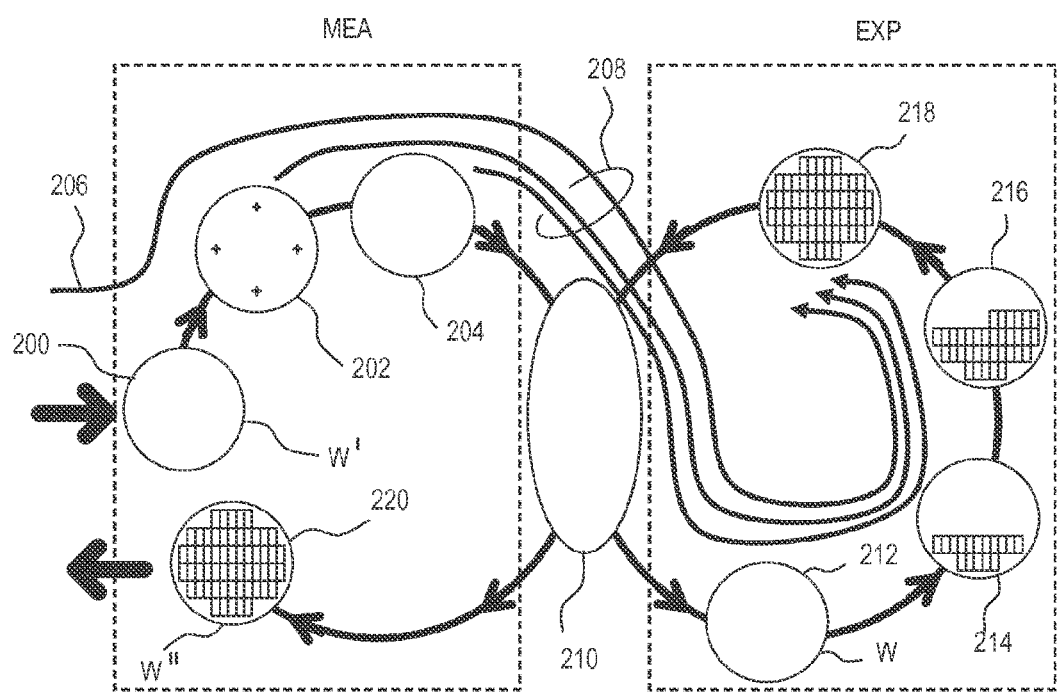
FIG. 2 illustrates schematically the stages in the measurement and exposure processes in the apparatus of FIG. 1.

FIG. 2 illustrates the known steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus. Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In FIG. 2, at 202, alignment measurements using the substrate marks P1 etc. and image sensors (not shown) are used to measure and record alignment of the substrate relative to substrate table WTa/WTb. In addition, several alignment marks across the substrate W' will be measured, to establish a "wafer grid", which maps very accurately the distribution of marks across the substrate, including any distortion relative to a nominal rectangular grid. At step 204, a map of substrate height against X-Y position is measured also, for use in accurate focusing of the exposed pattern.

When substrate W' was loaded, recipe data 206 were received, defining the exposures to be performed, and also properties of the substrate and the patterns previously made and to be made upon it. To these recipe data are added the measurements of substrate position, substrate grid and height map that were made at 202, 204, so that a complete set of recipe and measurement data 208 can be passed to the exposure stage. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further below, advanced models are known that use more parameters.

At 210, substrates W' and W are swapped, so that the measured substrate W' becomes the substrate W entering the exposure station EXP. This swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns. By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Selecting the optimal set of locations for measurements or features is an optimization problem.

A metaheuristic is a high-level procedure or heuristic designed to find, generate, or select a heuristic (partial search algorithm) that may provide a sufficiently good solution to an optimization problem, especially with incomplete or imperfect information or limited computation capacity.

An evolutionary algorithm (EA) is a generic population-based metaheuristic optimization algorithm.

A genetic algorithm (GA) is a type of EA. In a GA, a population of candidate solutions (called individuals, creatures, or phenotypes) to an optimization problem is evolved toward better solutions. Each candidate solution has a set of properties (its chromosomes or genotype), represented by a coordinate in the solution domain, which can be mutated and altered. Solutions may be represented in binary as strings of 0 s and 1 s, but other encodings are also possible.

Simulated annealing (SA) is a probabilistic technique for approximating the global optimum of a given function. SA is a metaheuristic to approximate global optimization in a large search space or solution domain.

Tabu search is another metaheuristic search method employing local search methods used for mathematical optimization.

Genetic algorithms maintain a pool of solutions rather than just one. New candidate solutions are generated not only by "mutation" (as in SA), but also by "recombination" of two solutions from the pool. Probabilistic criteria, similar to those used in SA, are used to select the candidates for duplication, mutation or combination (by cross-over), and for discarding excess solutions from the pool.

In mathematical optimization, a cost function or loss function is a function that maps an event or values of one or more variables onto a real number intuitively representing some "cost" associated with the event. An optimization problem seeks to minimize a cost function. An objective function may be either a cost function or its negative (sometimes called a merit function, reward function, a profit function, a utility function, a fitness function, etc.), in which case it is to be maximized.

A constraint is a condition of an optimization problem that the solution must satisfy.

Figure 3:
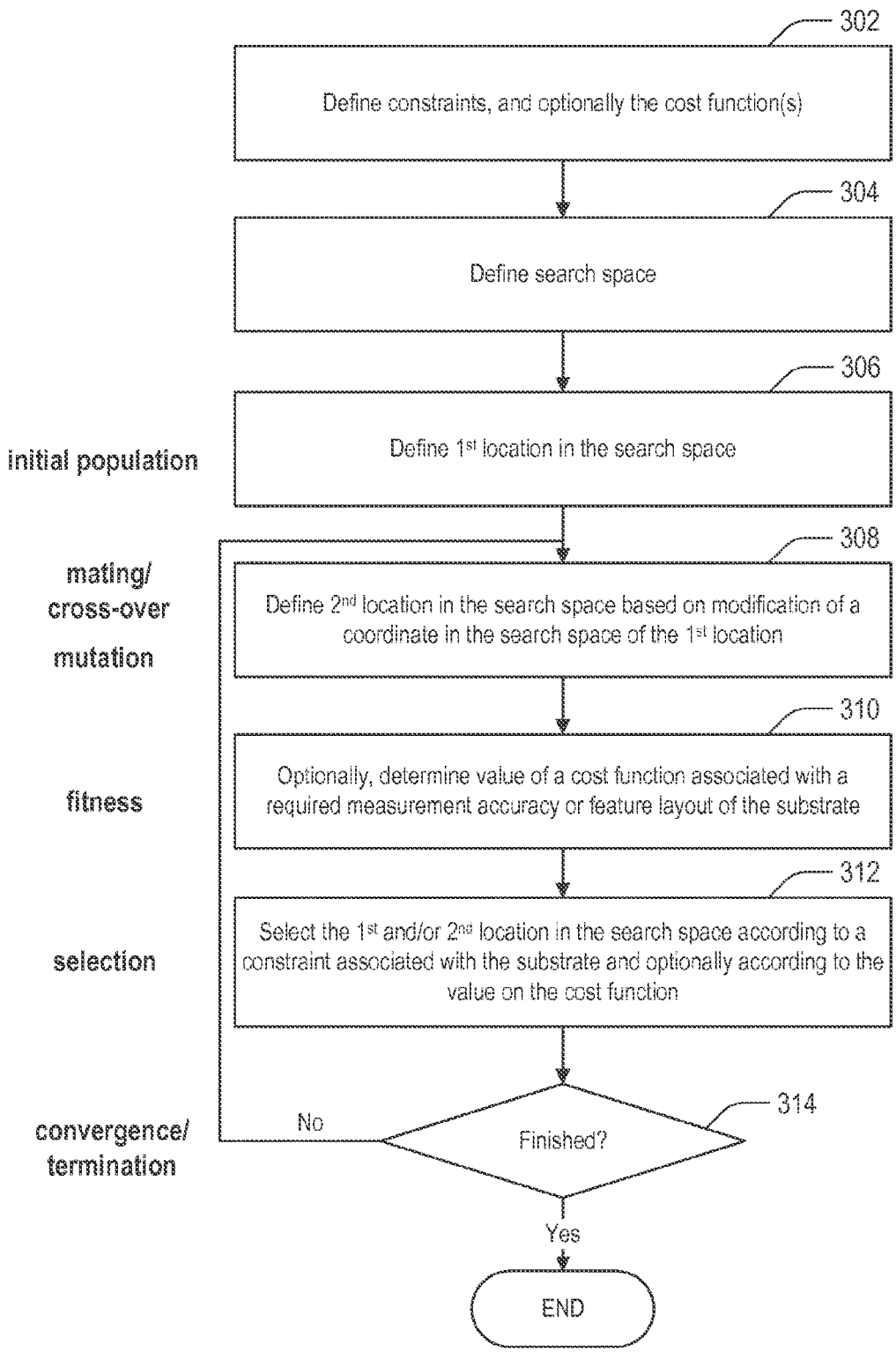
FIG. 3 is a flowchart illustrating a method according to an embodiment of the invention.

FIG. 3 is a flowchart illustrating a method for selecting an optimal solution comprising an optimal set of locations associated with a measurement or feature on a substrate according to an embodiment of the invention.

The method has the steps:

302: Defining constraints, and optionally cost function(s). These are discussed in more detail below. The cost function may calculate the difference between a modelled fingerprint and measured data. The cost function is used to give a value to an individual (candidate solution) to compare with other individuals (candidate solutions).

304: Defining the search space. For example, the search space may be the positions in a field where focus marks could be placed. The search space may be the feasible set of candidate solutions that satisfy all constraints. It may be the full set of measurement locations (i.e. all feasible locations). The boundaries of the search space may be defined by the dimensions of a wafer.

306: Defining a first candidate solution comprising a first set of locations. The first candidate solution is a set of one or more locations, for example mark or measurement locations in a field or on a wafer. Each candidate solution can be defined by coordinates in the search space. The first candidate solution may be an individual in a population of candidate solutions. In that case the population is a first generation.

This first candidate solution may be based on generation of random or pseudo-random coordinates in the search space.

The first candidate solution may be based on knowledge of the constraint. This knowledge can include the layout and layers used to make the product, for example a specific integrated circuit. The knowledge may include the topography and processing used to make the product, which constrain where marks or measurement points should be placed. For example, a constraint could be one or more of: no more than 5 marks per row; one mark for each die; 10 marks per field; and a limit on real estate used by the marks.

308: Defining a second candidate solution comprising a second set of locations in the search space, based on modification of a coordinate in the search space of the first candidate solution. Modification of the coordinate may involve one or more of the following operations: duplication; mutation; and cross-over. The second candidate solution may be an individual in a population of candidate solutions. In that case the population is a second generation, relative to the first candidate solution being in a first generation. Because there are many generations, first and second may refer to current and next, or previous and current.

310: Optionally, determine a value of a cost function associated with a required measurement accuracy or feature layout on the substrate.

312: Selecting the first and/or second candidate solution as the optimal solution according to a constraint associated with the substrate. Optionally, the selecting of the first and/or second candidate solution is further according to the (evaluated) value of the cost function.

The constraint may be associated with available positions for placement of features. For example, marks may only be allowed in scribe lanes or at the edge of the wafer. The marks are constrained to be on the wafer.

The constraint may be associated with a minimum distance required between the positions for placement of features and a forbidden region of the substrate. This is discussed below in relation to FIG. 5A.

The constraint may be associated with a minimum amount of measurements or features associated with a region on the substrate.

The constraint may be associated with a required degree of uniformity of measurement or feature locations as distributed across the substrate.

The cost function may be associated with one or more of the following.

The cost function may be associated with optimal determination of a focus metric across the substrate. For example, the cost function may calculate the difference between a modelled fingerprint and measured height data across the wafer.

The cost function may be associated with optimal determination of a substrate distortion characteristic. For example, the cost function may calculate the difference between a modelled fingerprint and height data measured across the wafer using a level sensor. The model may comprise a mesh model of the substrate surface.

The cost function may be associated with optimal positioning of focus markers across the substrate. For example, the cost function may calculate the difference between a modelled fingerprint and height data measured across the wafer. The model may comprise a mesh model of the substrate or functions such as a Taylor series.

The cost function may be associated with optimal positioning of alignment markers across the substrate. For example, the cost function may calculate the difference between a modelled fingerprint and x and y coordinate data measured across the wafer. The model may comprise a set of polynomial functions in terms of x and y. Instead of x and y, radial coordinates and functions may be used.

The cost function may be associated with optimal positioning of overlay markers across the substrate. For example, the cost function may calculate the difference between a modelled fingerprint and x and y coordinate data measured across the wafer. The model may comprise a set of polynomial functions in terms of x and y. Instead of x and y, radial coordinates and functions may be used.

The cost function may be associated with optimal positioning of dose markers across the substrate. For example, the cost function may calculate the difference between a modelled fingerprint and line thickness data measured across the wafer. The model may comprise a set of polynomial functions in terms of line thickness.

The cost function may be associated with optimal number of measurement or features taking measurement time into account. For example, the cost function may comprise a set of polynomial functions in terms of measurement time.

The cost function may be associated with a quality parameter of a fitting procedure performed on a graph of observables defined at one or more of the locations associated with the measurement and/or feature locations.

The cost function may be associated with a region on the substrate.

314: If the constraint is satisfied and (optionally) the value of a cost function has converged, or if a number of iterations has been reached, then the iterations end, otherwise control is passed back to step 308 for another iteration.

The steps of the method may be performed according to an evolutionary approach, in which case the first and second candidate solutions are individuals in successive populations of candidate solutions.

The steps of the method may be performed according to a simulated annealing approach, in which case the candidate solutions are states in a search space comprising the solution domain.

In another embodiment, described below with reference to FIGS. 4 to 6, an EASO (Evolutionary Algorithm for Scheme Optimization) is a search method for finding field mark locations to be employed in a mark-layout optimizer and an overlay optimizer (and a dose/CD optimizer). Each of these optimizers contribute to improved determination of process fingerprints by selection of one or more optimal solutions.

An optimal solution provides measurement locations or feature placement locations that improve accuracy of the determined process fingerprint, for example focus, overlay, or dose/CD fingerprint. It may also minimize the number of marks per field and maximize the focus correction per field (i.e. minimize the domain-relevant uncorrectable residual per field). The domain here may be focus, overlay or dose/CD. Uncorrectable residual means the residual that cannot be corrected by setting scanner parameters.

The algorithm is structured as an input set of data, the evolutionary algorithm (EA) optimization function.

Figure 4:
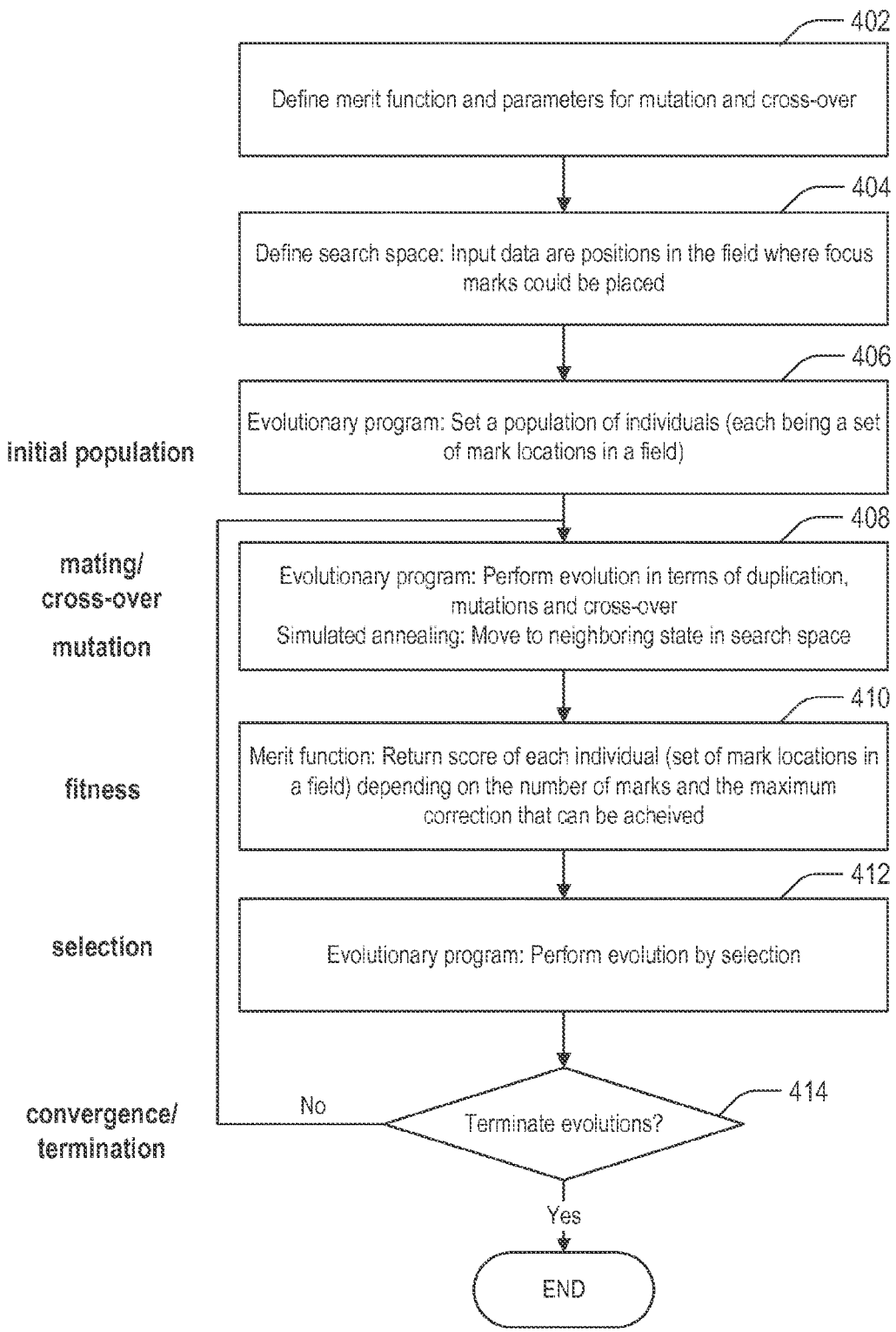
FIG. 4 is a flowchart illustrating a method according to another embodiment of the invention.

FIG. 4 is a flowchart illustrating a method according to another embodiment of the invention. The method has the steps:

402: The merit function and parameters for mutation and cross-over are defined.

A mutation probability parameter determines how often chromosome mutation takes place. A mutation probability of 100% results in the whole chromosome is changed. A mutation probability of 0% results in no change in the chromosome.

A cross-over probability parameter determines how often cross-over takes place. If there is no cross-over, the offspring is an exact copy of its parent. If there is a cross-over, the offspring is made from parts of parents' chromosomes. A cross-over probability of 100% results in all offspring being made by cross-over. A cross-over probability of 0% results in the whole new generation having exact copies of chromosomes from the previous generation, apart from mutation.

Figure 5A:
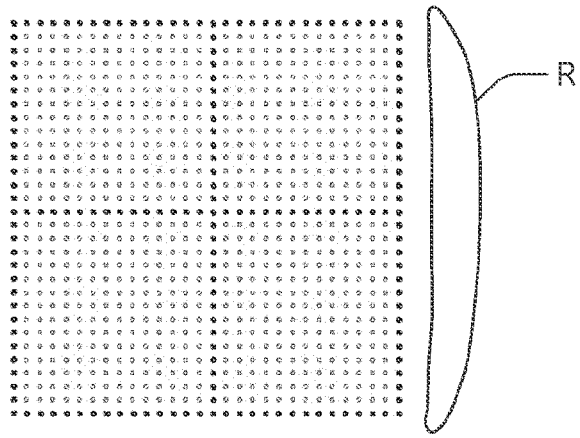
FIGS. 5A to 5C depict allowed mark positions, a conventionally optimized mark layout and a mark layout optimized according to an embodiment of the invention.

404: The input data are the positions in a field where focus marks could be placed, based on a-priori design knowledge of a die layout, and the defocus fingerprint that has an expected behavior that needs to be measured as accurately as possible. FIG. 5A shows the die layout with allowed mark positions surrounding four spaces left for product. The minimum possible defocus for the given layout with maximum possible (grid) number of marks is determined. Next, optimization is used to determine the closest defocus to this value with the minimum number of marks or a fixed number of marks.

406: The EA sets a population of individuals.

408: The EA performs the evolution in terms of duplication, mutations and cross-over. EA's are a widespread family of algorithms (belonging to machine learning) optimizing multi-dimensional complex problems. The method described with reference to FIG. 4 can be improved adding ad-hoc heuristics (i.e. limitations in the placement of marks, use of metrology data, etc.). In alternative embodiments, a simulated annealing approach or tabu search may be used by moving to a neighbor in the search space, or a random search.

410: Based on a certain individual, the merit function returns the score of such individual. An individual represents the mark locations in a field and its scores depend on the number of marks and the maximum correction that can be achieved with these marks. The merit function can be based on static or dynamic measures. A static measure refers to a specific set of wafers all belonging to the same exposure lot. In this case the merit function returns the residual of the correction on the wafers in this lot only. The correction is computed on the wafers which have been measured. A dynamic measure refers to a set of wafers belonging to a series of lots. In this case the merit function returns the residual as the result of a function considering the different lots. If for instance there are N lots (from 1 to N), then the measurements come from lot 1, the correction is computed only on these measurements but the correction is applied to all lots: from 1 to N. The merit function is then based on the residual of the N lots.

412: The EA continues to perform the evolution by selection.

414: If the value of the score is acceptable, or if a set number of evolutions has been reached, or if any other relevant halting condition is reached, then the iterations end, otherwise control is passed back to step 408 for another iteration.

The output of the algorithm is the best individual of the population after a finite number of evolutions, i.e. the individual having the least number of marks placed in a way to maximize the accuracy of focus fingerprint determination. In other words, the algorithm reduces the number of marks to be read out and minimize the wafer distortions after the wafer corrections are applied.

Figure 5B:
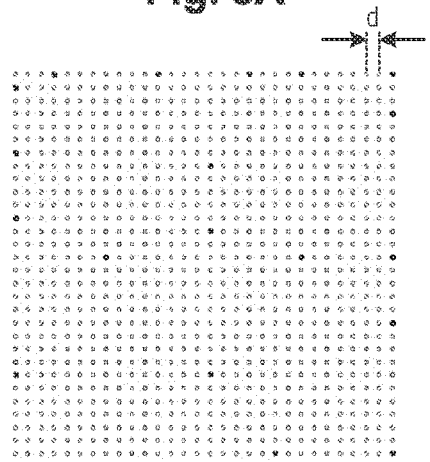
Figure 5C:
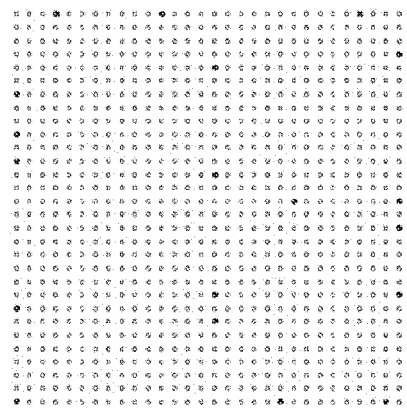

FIGS. 5A to 5C respectively depict plots of allowed mark positions, a conventionally optimized mark layout and a mark layout optimized according to an embodiment of the invention.

FIG. 5A depicts the allowed mark positions in a field (in the 10×10 layout, the empty spaces are where 4 dies are placed). Constraints are illustrated with a region, R, where no marks are allowed, such as the edge of a wafer, and a minimum distance d between marks.

FIG. 5B depicts the mark layout used by a conventional optimizer (with 16 marks).

FIG. 5C depicts the mark layout as found by the method according to an embodiment of the invention.

In an embodiment, the focus metric that is optimized is the 3×standard-deviation (3*std) across the wafer, called the focus uniformity. The aim is to have a minimum value of 3*std after the focus optimizer has been applied to the raw data.

The optimized layout of FIG. 5C is a subsample of the full layout shown in FIG. 5A. The 3*std of an optimized layout is sensitive to the position of the marks. Fewer marks give less optimal estimation of the true field fingerprint.

In order to compare reduced (optimized) layouts fairly, the correction potential of focus model subrecipes for each of the layouts is compared to a full layout.

A focus model subrecipe is the inverse of the modeled fingerprint. Hence, less accurate fingerprints will lead to worse correction subrecipes. This results in higher z-variation of the wafer in the focus model (higher 3*std) after correction.

For overlay, it is slightly different, because there are many overlay marks and the overlay optimizer has to choose which ones need to be read, to get the optimal fingerprint estimation. But this happens only on wafer level and does not scale down to individual fields. Hence, both (focus and overlay) optimizers look for the smallest 3*std across the wafer, but overlay concerns just wafer-level variation, whilst focus optimization needs to take into account variation across individual fields too.

Figure 5D:
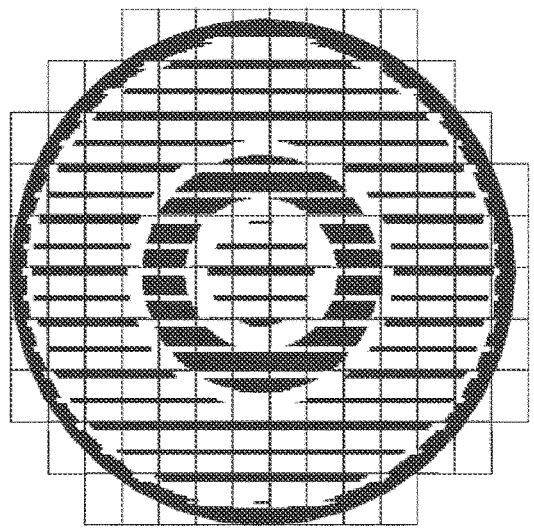
FIGS. 5D and 5E depict a focus map before and after correction respectively.
Figure 5E:
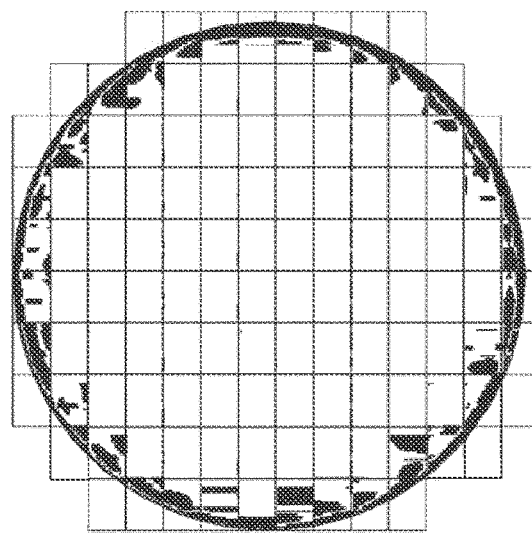

FIGS. 5D and 5E depict a focus map before and after correction respectively. The exposure fields are shown as rectangles. A printed image on the substrate has sufficient contrast only in a limited (vertical) range around a best focus of exposure, shown as white regions within the circular wafer edge. The black features on the circular wafer represent out-of-focus regions. In FIG. 5D, the black horizontal bands are examples of intrafield focus variation. The circular bullseye pattern near the center of the wafer and the edge roll-off around the rim are examples of interfield focus variation. Together the intrafield and interfield variation make the focus fingerprint. FIG. 5E depicts the corrected focus map with much larger white areas of correct focus.

Figure 6:
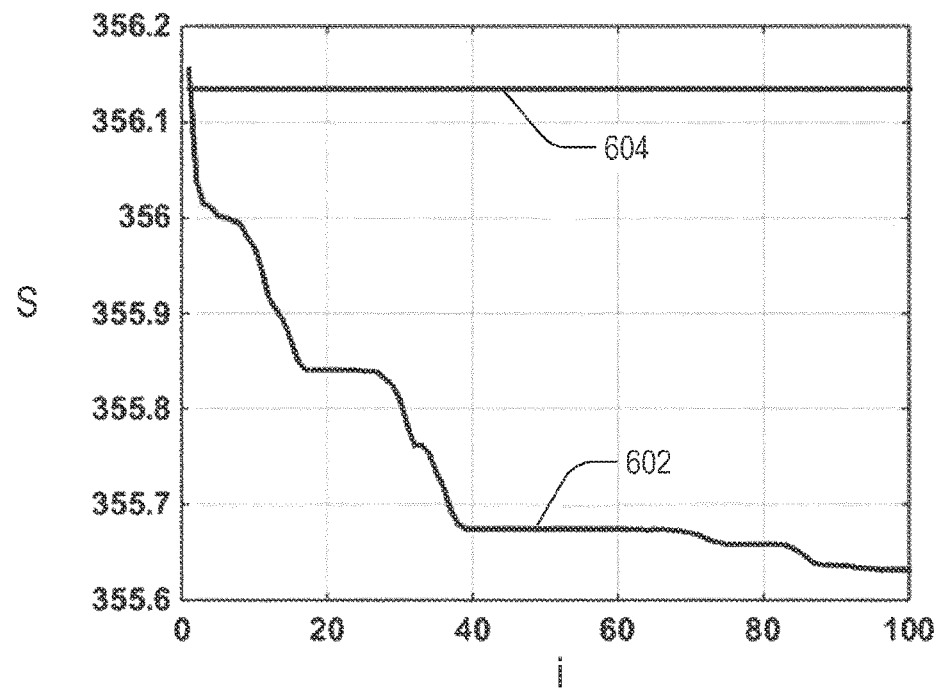
FIG. 6 is a graph of the sum of the standard deviation (sigma) of the residual, being optimized according to an embodiment of the invention.

FIG. 6 is a graph of the sum of the standard deviation (sigma) of the residual, being optimized according to this embodiment of the invention. Residual is defined as the original shape minus the correction.

FIG. 6 shows the sum of the standard deviation (sigma) of the residual for the whole population 602 and for one of the initial individuals 604 over the 100 evolutions, i, of the method according to an embodiment of the invention.

The found mark layout is a good improvement compared to a conventional optimizer because it halves measurement time without affecting the correction potential.

The method described with reference to FIG. 4 has the features:
- it takes into account the constraints present in a mark-layout optimizer in order to achieve a meaningful focus correction;
- it uses sets of polynomials needed by focus to describe the field shape;
- it can minimize the number of marks per field; and
- it employs a multi-objective optimization evolutionary algorithm.

The method described with reference to FIG. 4 advantageously:
- increases 'real estate' available on the reticle for product features (used for making integrated circuit product);
- reduces the residual: the exposures will be on more accurate focus (and overlay) values; and
- reduces the number of marks per field which leaves more room for product features and/or other marks (for example overlay/dose/CD/etc.).

The method described with reference to FIG. 4 advantageously provides an algorithm for determining the minimum number of marks and marks' placement within fields which requires minimal a-priori user knowledge of the product features and that can be employed for both overlay and focus.

The method described with reference to FIG. 4, by combining sample scheme optimizer and mark layout optimizer functionalities, can be implemented for focus.

In another embodiment, described below with reference to FIGS. 7 to 9, a genetic multi-objective binary optimization is used for a sample scheme optimizer.

Figure 7:
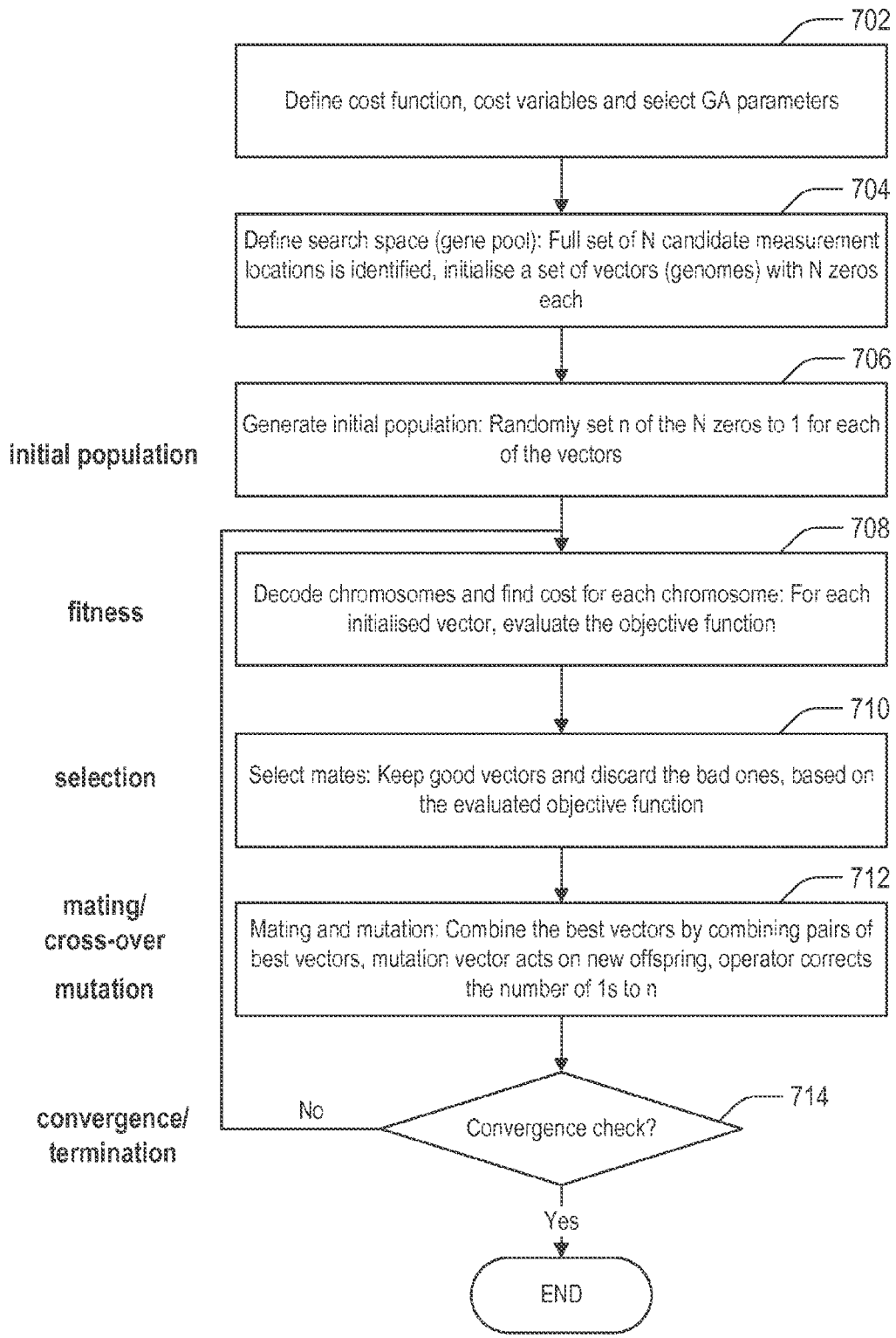
FIG. 7 is a flowchart illustrating a method according to another embodiment of the invention.

FIG. 7 is a flowchart illustrating a method according to this embodiment of the invention. The method has the following steps:

702: The cost function is defined. The GA (Genetic Algorithm) parameters are selected.

704: The search space (gene pool) is defined. The full candidate set of measurement locations is identified (i.e. all feasible locations), let us say that N positions are "available" as candidate position. Next, a set of vectors is initialized, each of those vectors is of length N and filled completely with zeros. The ordering within the vectors corresponds exactly with that of the full design matrix of the experiment (i.e. the design matrix for the full dataset). These vectors are the chromosomes. They each 'code' a candidate solution to the optimization problem in the form of a Boolean mask; the vectors are comprised of exclusively zeros and ones. Wherever there is a one, the corresponding row of the design matrix is included. Wherever a zero occurs, the corresponding rows of the design matrix are disregarded (i.e. eliminated from the system of model equations).

706: The initial population is generated. Assuming we have n positions available (driven by throughput impact) to measure, exactly n out of the N zeros are randomly set to equal to one for each of the vectors. Inclusion or exclusion of specific measurement positions is coded by a one or zero respectively.

708: In GA terms, the "chromosomes" are decoded and the cost for each chromosome is found. For each of the initialized vectors, an objective function is evaluated. For this example, the objective function is a combination of D-optimality (minimization of variance for estimated parameters) combined with a term favoring uniformity and penalizing selected measurement positions lying very close together. In order to define uniformity, Delaunay triangulation is used.

710: In the "select mates" step, once the objective function is evaluated for each of the vectors, the good ones will be kept, and the bad ones will be discarded. Good and bad may be defined as being either side of a threshold value of the evaluated objective function. The amounts are configurable, as is the total population size (i.e. the total amount of vectors).

712: In the "mating and mutation" step, the vectors which were discarded are replaced by combining the best ones into new vectors in a similar way as happens through breeding/mating in nature. Best solutions are randomly teamed up in pairs of two, and will produce offspring whose vector is a combination of that of the parents. Furthermore, in order to introduce variation, a mutation vector will act on the newly generated offspring turning some ones into zeros and the other way around. Lastly, in order to provide that there are exactly n ones in the vector (and N-n zeros), there is an operator checking if there is a shortage or surplus of ones in the vector, and accordingly (again in random fashion) fixing this by putting the proper amount of ones to zeros or the other way around.

714: In the convergence check step, stopping criteria are typically constituted by the maximum number of iterations and the change in objective function becoming too small over a certain number of iterations (e.g. the past hundred iterations), otherwise control is passed back to step 708 for another iteration.

For the new population, again the objective function is evaluated at step 708, and again the best vectors will produce offspring in the way described above, and so on.

The mutation rate starts out high (lots of mutations), and throughout the optimization will drop towards a small number (very few mutations). The rationale for this is that in the early phase of the optimization we want a lot of diversity so as to cover as much of the "search space" as possible (i.e. the space holding all combinations of possible solutions to the optimization problem). However, if mutation remains high, the algorithm will never converge towards a solution. The lowest value of the mutation rate can either be set to a fixed value, but it can also be dynamically adjusted to increase/decrease by observing the amount of variation in the population (i.e. the standard deviation of their function value (with respect to the objective function)).

Throughout the optimization process (i.e. each iteration), the population size is fixed, as is the amount of ones as well as the amount of zeros within any vector. The vector can be seen as the genome, the algorithm as a natural selection method (and the search space is the gene pool).

Figure 8:
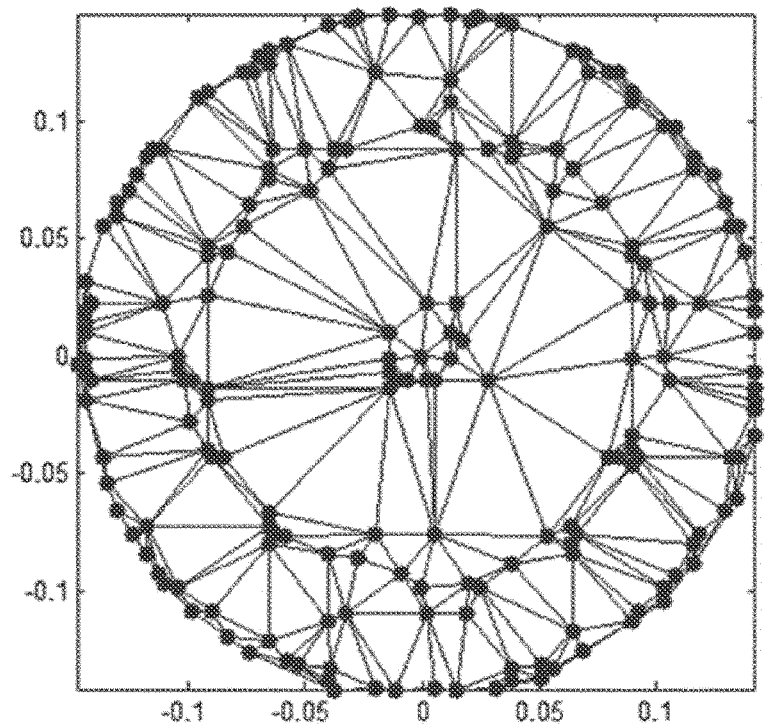
FIG. 8 depicts a triangulated sample scheme for non-uniform sampling typical of a conventional sample scheme optimizer.

FIG. 8 depicts a triangulated sample scheme for non-uniform sampling typical of a conventional sample scheme optimizer. The scheme as depicted in FIG. 8 is optimized solely for minimizing the model uncertainty. The drawback is that when the model for which it was optimized is not a good model for describing the actual disturbance fingerprint, the fingerprint will not be detected. Furthermore, the scheme of FIG. 8 has large spatial gaps in it. A large number of fields without any measurement is undesired in production since defectivity inspection cannot be done for those fields.

Figure 9:
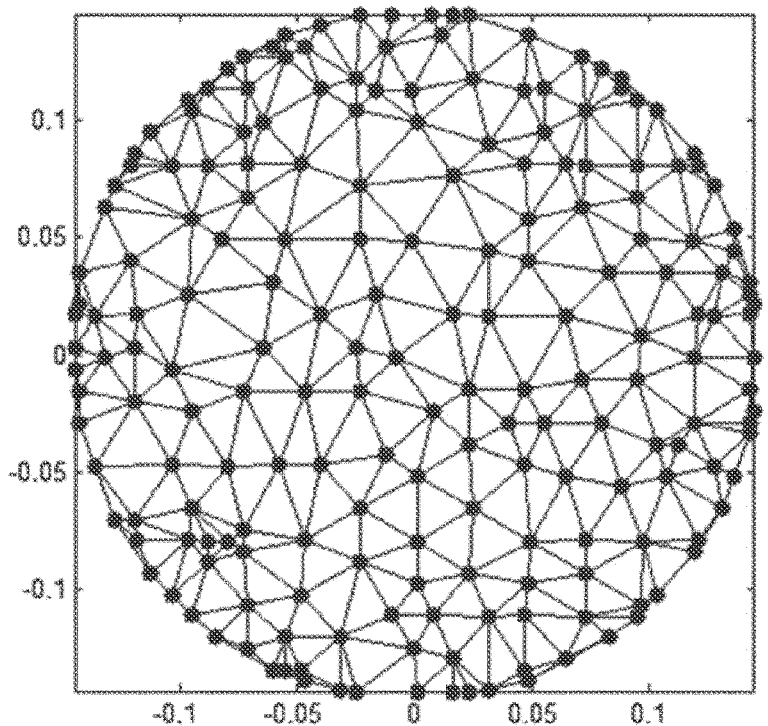
FIG. 9 depicts a triangulated sample scheme resulting from a method according to an embodiment of the invention.

FIG. 9 depicts a triangulated sample scheme resulting from the method described with reference to FIG. 7. The scheme of FIG. 9 is optimized for minimizing the model uncertainty while the constraint is associated with a required degree of uniformity of measurement or feature locations as distributed across the substrate.

The method described with reference to FIGS. 7 and 9 is fast, and allows for multi-objective optimization. Beyond optimizing for design of experiments it also explicitly takes uniform wafer coverage into account, thus making the optimized sampling scheme layout suitable for monitoring and making the optimized sample scheme robust against model mismatch.

Figure 11:
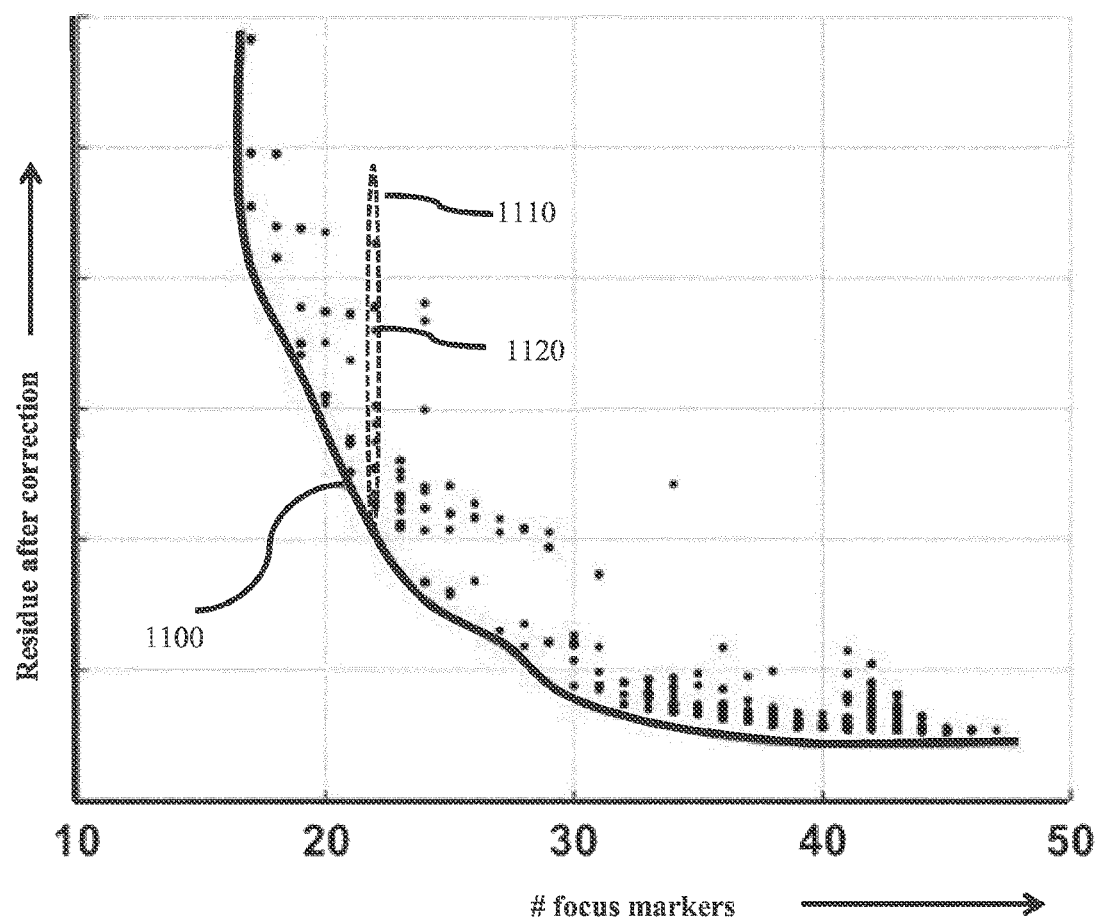
FIG. 11 illustrates the concept of the use of a Pareto front according to an embodiment of the invention.

FIG. 11 illustrates an example of the use of a Pareto front representation of a multi-objective problem. A Pareto front is defined as a relation between objectives (e.g. to be optimized parameters) associated with a multi-objective optimization problem. The Pareto front 1100 of FIG. 11 demonstrates the relation between a first objective of maximizing focus correction potential on the y-axis (minimum achievable residue of focus errors after correction) and a second objective of using a minimal amount of focus markers (or focus measurements) on the x-axis. The Pareto front may be established by calculation of a plurality of configurations (e.g. candidate solutions) and determine for each configuration a measure of the objectives (e.g. a focus correction residue and a number of markers used to achieve this). In FIG. 11 each dot 1120 represents a certain configuration (distribution) of the focus markers (measurements) across the substrate and the residual after correction when this configuration is applied. It is clear from the figure that certain configurations are better suitable for determining a focus correction using a certain number of focus markers than other configurations. This is further illustrated by the selection 1110 of a set of focus marker configurations, given a constant number of markers. The Pareto front 1100 may be approximated by fitting a curve at the lower end of the distributions 1110 (e.g. lowest residual focus error as a function of the number of markers).

In an embodiment solving of the multi-objective problem using any of the previously described methods (Evolutionary Algorithm, Genetic Algorithm, Evolutionary Algorithm for Scheme Optimization, Simulated Annealing, tabu search) includes determination of a Pareto front, wherein the Pareto front establishes a relation between a first objective and a second objective. In the example of FIG. 11, the first objective is a focus error residue after focus correction and the second objective is minimization of the number of utilized focus markers and/or the number of focus measurements performed on the focus markers. The Pareto front may however be determined to establish the relation between any suitable first objective and second objective, for example, but not limited to, the first objective may be associated with any of: an overlay error residue, a dose error residue, a Critical Dimension error residue, the second objective may be associated with any of: a number of markers used, a number of measurements performed.

FIG. 11 demonstrates a one-dimensional Pareto Front, establishing a relation between two objectives. In general the concept of the Pareto Front is however not limited to a one-dimensional representation, a Pareto Front may indicate the relation between three or more objectives associated with a multi-objective problem. In such a case the Pareto Front may be a surface in two or more dimensions.

Figure 10:
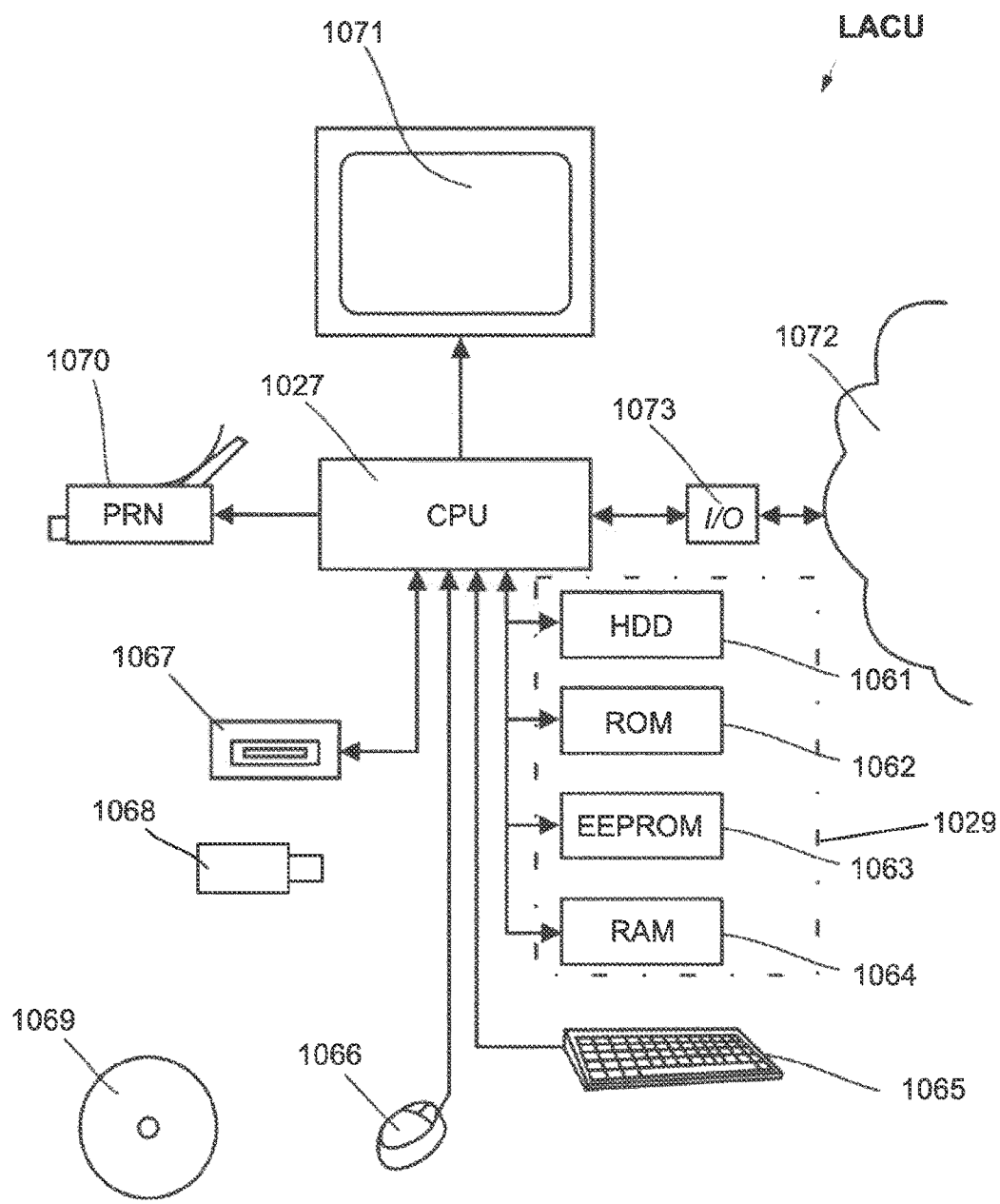
FIG. 10 illustrates computer system hardware useful in implementing the methods disclosed herein.

The steps of the methods described above can be automated within the lithography apparatus control unit LACU shown in FIG. 1. This unit LACU may include a computer assembly as shown in FIG. 10. The computer assembly may be a dedicated computer in the form of a control unit in embodiments of the assembly according to an embodiment of the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 1029 connected to processor 1027 may comprise a number of memory components like a hard disk 1061, Read Only Memory (ROM) 1062, Electrically Erasable Programmable Read Only Memory (EEPROM) 1063 or Random Access Memory (RAM) 1064. Not all aforementioned memory components need to be present. Furthermore, it is not essential that aforementioned memory components are physically in close proximity to the processor 1027 or to each other. They may be located at a distance away The processor 1027 may also be connected to some kind of user interface, for instance a keyboard 1065 or a mouse 1066. A touch screen, track ball, speech converter or other interfaces that are known to persons skilled in the art may also be used.

The processor 1027 may be connected to a reading unit 1067, which is arranged to read data, e.g. in the form of computer executable code, from and under some circumstances store data on a data carrier, like a solid-state drive 1068 or a CDROM 1069. Also DVD's or other data carriers known to persons skilled in the art may be used.

The processor 1027 may also be connected to a printer 1070 to print out output data on paper as well as to a display 1071, for instance a monitor or LCD (Liquid Crystal Display), of any other type of display known to a person skilled in the art.

The processor 1027 may be connected to a communications network 1072, for instance a public switched telephone network (PSTN), a local area network (LAN), a wide area network (WAN) etc. by means of transmitters/receivers 1073 responsible for input/output (I/O). The processor 1027 may be arranged to communicate with other communication systems via the communications network 1072. In an embodiment of the invention external computers (not shown), for instance personal computers of operators, can log into the processor 1027 via the communications network 1072.

The processor 1027 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1027 may even be located a distance away of the other processing units and communicate via communications network 1072. Connections between modules can be made wired or wireless.

The computer system can be any signal processing system with analogue and/or digital and/or software technology arranged to perform the functions discussed here.

Further embodiments of the invention are disclosed in the list of numbered embodiments below:

1. A method for selecting an optimal solution comprising an optimal set of locations associated with a measurement or feature on a substrate, the method comprising the steps of:
    defining a first candidate solution comprising a first set of locations;
    defining a second candidate solution comprising a second set of locations based on modification of a coordinate in a solution domain of the first candidate solution; and
    selecting the first and/or second candidate solution as the optimal solution according to a constraint associated with the substrate.
2. A method according to embodiment 1, wherein the step of defining the first candidate solution is based on generation of a random or pseudo-random number.
3. A method according to embodiment 1 or embodiment 2, wherein the step of defining the first candidate solution is based on knowledge of the constraint.
4. A method according to any preceding embodiment, wherein modification of the coordinate involves an operation selected from the list of operations: duplication; mutation; and cross-over.
5. A method according to any preceding embodiment, wherein the first and second candidate solutions are individuals in successive populations of candidate solutions and the coordinate steps are performed according to an evolutionary approach.
6. A method according to any preceding embodiment, wherein the candidate solutions are states in a search space comprising the solution domain and the steps are performed according to a simulated annealing approach.
7. A method according to any preceding embodiment, wherein the step of selecting the first and/or second candidate solution is further according to a value of a cost function associated with a required measurement accuracy or feature layout on the substrate.
8. A method according to embodiment 7, wherein the cost function is associated with optimal determination of a focus metric across the substrate.
9. A method according to embodiment 7, wherein the cost function is associated with optimal determination of a substrate distortion characteristic.
10. A method according to embodiment 7, wherein the cost function is associated with optimal positioning of focus markers across the substrate.
11. A method according to embodiment 7, wherein the cost function is associated with optimal positioning of alignment markers across the substrate.
12. A method according to embodiment 7, wherein the cost function is associated with a quality parameter of a fitting procedure performed on a graph of observables defined at one or more of the locations associated with the measurement and/or feature locations.
13. A method according to any preceding embodiment, wherein the constraint is associated with available positions for placement of features.
14. A method according to any preceding embodiment, wherein the constraint is associated with a minimum distance required between the positions for placement of features and a forbidden region of the substrate.
15. A method according to any preceding embodiment, wherein the constraint is associated with a minimum amount of measurements or features associated with a region on the substrate.
16. A method according to any preceding embodiment, wherein the constraint is associated with a required degree of uniformity of measurement or feature locations as distributed across the substrate.
17. A method according to any preceding embodiment, wherein the substrate is a patterning device.
18. A method according to any preceding embodiment, wherein the substrate is a wafer.
19. A method according to embodiment 7, wherein the cost function is associated with optimal positioning of overlay markers across the substrate.

20. A method according to embodiment 7, wherein the cost function is associated with optimal positioning of dose markers across the substrate.

21. A method according to embodiment 7, wherein the cost function is associated with an optimal number of measurements or features taking measurement time into account.

22. A method according to any of embodiments 7 to 21, wherein the cost function is associated with a region on the substrate.

23. A method according to any preceding embodiment, wherein a Pareto front is determined establishing a relation between a first objective of selecting the optimal solution comprising an optimal set of locations and a second objective of selecting the optimal solution comprising an optimal set of locations.

24. A method according to embodiment 23, wherein the first objective is associated with optimal determination of a focus metric across the substrate and the second objective is associated with an optimal number of measurements or features.

25. A computer program comprising computer readable instructions which, when run on suitable computer apparatus, cause the computer apparatus to perform the method of any one of embodiments 1 to 24.

26. A computer program product comprising the computer program of embodiment 25.

27. Apparatus specifically adapted to carry out the steps of the method of any of embodiments 1 to 24.

28. Apparatus according to embodiment 27 specifically configured as a lithographic apparatus operable to perform a lithographic process on said substrate.

29. A method for selecting an optimal solution comprising an optimal set of locations on a substrate associated with positions configured for performing measurements or placement of features, the method comprising:
    defining a first candidate solution comprising a first set of locations;
    defining a second candidate solution comprising a second set of locations based on modification of a coordinate in a solution domain of the first candidate solution, wherein the modification of the coordinate involves an operation selected from one or more of: duplication, mutation and cross-over; and
    selecting the first and/or second candidate solution as the optimal solution according to a constraint associated with one or more of: available positions for placement of features on the substrate, available measurement time, a minimum amount of measurements or features associated with a region on the substrate and a required degree of uniformity of measurement or feature locations as distributed across the substrate.

30. A method according to embodiment 29, wherein the step of defining the first candidate solution is based on generation of a random or pseudo-random number.

31. A method according to embodiment 29, wherein the step of defining the first candidate solution is based on knowledge of the constraint.

32. A method according to embodiment 29, wherein the first and second candidate solutions are individuals in successive populations of candidate solutions and the steps of the method are performed according to an evolutionary approach.

33. A method according to embodiment 29, wherein the step of selecting the first and/or second candidate solution is further according to a value of a cost function associated with a required measurement accuracy or feature layout on the substrate.

34. A method according to embodiment 33, wherein the cost function is associated with optimal determination of a focus metric across the substrate.

35. A method according to embodiment 33, wherein the cost function is associated with optimal determination of a substrate distortion characteristic.

36. A method according to embodiment 33, wherein the cost function is associated with optimal positioning of focus markers, alignment markers, dose markers or overlay markers across the substrate.

37. A method according to embodiment 33, wherein the cost function is associated with a quality parameter of a fitting procedure performed on a graph of observables defined at one or more of the locations associated with the measurement and/or feature locations.

38. A method according to embodiment 29, wherein the substrate is a patterning device or a wafer.

39. A method according to embodiment 33, wherein the cost function is associated with an optimal number of measurements or features taking measurement time into account.

40. A method according to embodiment 29, further comprising determination of a Pareto front establishing a relation between a first objective of selecting the optimal solution comprising an optimal set of locations and a second objective of selecting the optimal solution comprising an optimal set of locations.

41. A computer program comprising computer readable instructions which, when run on suitable computer apparatus, cause the computer apparatus to perform the method of embodiment 29.

42. A lithographic apparatus specifically adapted to carry out the steps of the method of embodiment 29.

43. A method for selecting an optimal solution comprising an optimal set of locations on a substrate associated with positions configured for performing measurements or placement of features, the method comprising:
    defining a first candidate solution comprising a first set of locations;
    defining a second candidate solution comprising a second set of locations based on modification of a coordinate in a solution domain of the first candidate solution; and
    selecting the first and/or second candidate solution as the optimal solution according to a constraint associated with one or more of: available positions for placement of features on the substrate, available measurement time, a minimum amount of measurements or features associated with a region on the substrate and a required degree of uniformity of measurement or feature locations as distributed across the substrate,
    wherein the first and second candidate solutions are states in a search space comprising the solution domain and the steps are performed according to a simulated annealing approach.

The term substrate used herein may refer to a wafer or a patterning device such as a reticle. In lithography, a reticle has a pattern which is imaged to a target substrate, such as a wafer.

Although specific reference may be made in this text to the use of lithographic apparatus in the manufacture of ICs, it should be understood that the lithographic apparatus described herein may have other applications, such as the processing of substrates in the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "field"/"die"

herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. In addition, it should be appreciated that structural features or method steps shown or described in any one embodiment herein can be used in other embodiments as well.

The invention claimed is:

1. A method comprising:
   defining a first set comprising one or more candidate solutions, each of the candidate solution of the first set comprising a set of locations;
   defining a second set comprising one or more candidate solutions, each of the candidate solution of the second set comprising a set of locations generated by modification of one or more candidate solutions from the first set, wherein the modification involves an operation selected from: duplication, mutation and/or cross-over;
   selecting, by a hardware computer system, one or more candidate solutions from the first set and/or second set as an optimal solution comprising an optimal set of locations on a substrate associated with positions configured for performing measurements or placement of features; and
   configuring a measurement or manufacturing process based on, or on information derived from, the optimal solution and/or providing a signal representing, or based on, the optimal solution to a tool or system for use by the tool or system in controlling or configuring a measurement or manufacturing process.

2. The method according to claim 1, wherein the generation of the set of locations of the second set and/or the selecting the optimal solution is based on an objective function.

3. The method according to claim 1, wherein, in the defining the second set and/or selecting the optimal solution, one or more candidate solutions and/or one or more optimal solutions are rejected if the one or more candidate solutions and/or one or more optimal solutions do not fulfill one or more constraints associated with one or more selected from: available positions for placement of features on the substrate, available measurement time, a minimum amount of measurements or features associated with a region on the substrate and/or a required degree of uniformity of measurement or feature locations as distributed across the substrate.

4. The method according to claim 1, wherein the defining the first set is based on generation of a random or pseudo-random number.

5. The method according to claim 1, wherein the defining the first set is based on knowledge of a constraint.

6. The method according to claim 1, wherein the one or more candidate solutions in the first set and/or second set comprise individuals in successive populations of candidate solutions and the method is performed according to an evolutionary approach.

7. The method according to claim 1, wherein the selecting the first set and/or second set is further according to a value of a cost function associated with a required measurement accuracy or feature layout on the substrate.

8. The method according to claim 7, wherein the cost function is associated with optimal determination of a focus metric across the substrate.

9. The method according to claim 7, wherein the cost function is associated with optimal determination of a substrate distortion characteristic.

10. The method according to claim 7, wherein the cost function is associated with optimal positioning of focus markers, alignment markers, dose markers or overlay markers across the substrate.

11. The method according to claim 7, wherein the cost function is associated with a quality parameter of a fitting procedure performed on data of observables defined at one or more of the locations associated with the measurement and/or at one or more feature locations.

12. The method according to claim 7, wherein the cost function is associated with an optimal number of measurements or features taking measurement time into account.

13. The method according to claim 1, wherein the substrate is a patterning device or a wafer.

14. The method according to claim 1, further comprising determination of a Pareto front establishing a relation between a first objective of selecting the optimal solution and a second objective of selecting the optimal solution.

15. A computer program product comprising a non-transitory computer-readable medium having instructions therein, the instructions, when executed by a computer system, configured to cause the computer system to at least:

define a first set comprising one or more candidate solutions, each candidate solution of the first set comprising a set of locations;

define a second set comprising one or more candidate solutions, each candidate solution of the second set comprising a set of locations generated by modification of one or more candidate solutions from the first set, wherein the modification involves an operation selected from: duplication, mutation and cross-over;

select one or more candidate solutions from the first set and/or second set as an optimal solution comprising an optimal set of locations on a substrate associated with positions configured for performing measurements or placement of features; and configure a measurement or manufacturing process based on, or on information derived from, the optimal solution and/or provide a signal representing, or based on, the optimal solution to a tool or system for use by the tool or system in controlling or configuring a measurement or manufacturing process.

16. A method comprising:

defining a first set comprising one or more candidate solutions, each candidate solution of the first set comprising a set of locations;

defining a second set comprising one or more candidate solutions, each candidate solution of the second set comprising a set of locations generated by modification of one or more candidate solutions from the first set; and selecting one or more candidate solutions from the first set and/or second set as an optimal solution comprising an optimal set of locations on a substrate associated with positions configured for performing measurements or placement of features; and configuring a measurement or manufacturing process based on, or on information derived from, the optimal solution and/or providing a signal representing, or based on, the optimal solution to a tool or system for use by the tool or system in controlling or configuring a measurement or manufacturing process.

17. The method according to claim 16, wherein the generating of the set of locations of the second set and/or the selecting the optimal solution is based on an objective function.

18. The method according to claim 16, wherein, in the defining the second set and/or selecting the optimal solution, one or more candidate solutions and/or one or more optimal solutions are rejected if the one or more candidate solutions and/or one or more optimal solutions do not fulfill one or more constraints associated with one or more selected from: available positions for placement of features on the substrate, available measurement time, a minimum amount of measurements or features associated with a region on the substrate and/or a required degree of uniformity of measurement or feature locations as distributed across the substrate.

19. The method according to claim 16, wherein the candidate solutions in the first set and the second set are states in a search space comprising a solution domain of the candidate solutions and the method is performed according to a simulated annealing approach.

20. A computer program product comprising a non-transitory computer-readable medium having instructions therein, the instructions, when executed by a computer system, configured to cause the computer system to at least:

define a first set comprising one or more candidate solutions, each candidate solutions of the first set comprising a set of locations;

define a second set comprising one or more candidate solutions, each candidate solution of the second set comprising a set of locations generated by modification of one or more candidate solutions from the first set; and select one or more candidate solutions from the first set and/or second set as an optimal solution comprising an optimal set of locations on a substrate associated with positions configured for performing measurements or placement of features; and configure a measurement or manufacturing process based on, or on information derived from, the optimal solution and/or provide a signal representing, or based on, the optimal solution to a tool or system for use by the tool or system in controlling or configuring a measurement or manufacturing process.

* * * * *